(12) United States Patent
Kim

(10) Patent No.: US 7,779,341 B2
(45) Date of Patent: Aug. 17, 2010

(54) NAND FLASH MEMORY DEVICE PERFORMING ERROR DETECTING AND DATA RELOADING OPERATION DURING COPY BACK PROGRAM OPERATION

(75) Inventor: Hyung-Gon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1134 days.

(21) Appl. No.: 11/430,867

(22) Filed: May 10, 2006

(65) Prior Publication Data

US 2007/0067705 A1 Mar. 22, 2007

(30) Foreign Application Priority Data

Sep. 7, 2005 (KR) .................... 10-2005-0083216

(51) Int. Cl.
*G06F 11/00* (2006.01)
(52) U.S. Cl. ...................... 714/801; 714/766
(58) Field of Classification Search ................ 714/766, 714/801

See application file for complete search history.

(56) References Cited

U.S. PATENT DOCUMENTS

| | | | | |
|---|---|---|---|---|
| 5,134,616 | A * | 7/1992 | Barth et al. ................ | 714/711 |
| 5,313,425 | A * | 5/1994 | Lee et al. .................... | 365/201 |
| 6,697,992 | B2 * | 2/2004 | Ito et al. ..................... | 714/763 |
| 6,717,857 | B2 | 4/2004 | Byeon et al. | |
| 7,010,741 | B2 * | 3/2006 | Foss et al. ................... | 714/805 |
| 7,159,069 | B2 * | 1/2007 | Adusumilli et al. ......... | 711/103 |
| 2003/0115538 | A1 * | 6/2003 | Derner et al. ............... | 714/773 |
| 2004/0083421 | A1 * | 4/2004 | Foss et al. ................... | 714/805 |
| 2004/0221092 | A1 | 11/2004 | Lee | |
| 2005/0094476 | A1 * | 5/2005 | Noda .......................... | 365/232 |
| 2005/0289314 | A1 * | 12/2005 | Adusumilli et al. ......... | 711/168 |
| 2006/0195624 | A1 * | 8/2006 | Chikusa et al. .............. | 710/5 |
| 2007/0286001 | A1 * | 12/2007 | Osada et al. ................ | 365/200 |

FOREIGN PATENT DOCUMENTS

| | | |
|---|---|---|
| JP | 11-176177 | 7/1999 |
| JP | 2003-141882 | 5/2003 |
| JP | 2004-327021 | 11/2004 |
| KR | 1020030033679 A | 5/2003 |
| KR | 1020040086923 A | 10/2004 |
| KR | 1020040093365 A | 11/2004 |
| KR | 1020060022144 A | 3/2006 |
| KR | 1020060023428 A | 3/2006 |

* cited by examiner

*Primary Examiner*—M. Mujtaba K Chaudry
(74) *Attorney, Agent, or Firm*—Volentine & Whitt, PLLC

(57) ABSTRACT

A NAND flash memory device performing an error detecting and data reloading operation during a copy back program operation is provided. The device includes a cell array having a plurality of planes and a parity cell array having a plurality of parity planes. Each of the parity planes stores a parity of each of the planes. Additionally, the device includes a parity generating and parity column selecting circuit generating a new parity about reloaded data from an outside during a copy back program operation, and storing the new parity on a parity plane corresponding to a plane on which the reloaded data is stored.

7 Claims, 4 Drawing Sheets

NAND FLASH MEMORY DEVICE PERFORMING ERROR DETECTING AND DATA RELOADING OPERATION DURING COPY BACK PROGRAM OPERATION

BACKGROUND OF THE INVENTION

1. Field of the Invention

Embodiments of the invention relate to a semiconductor memory device. More particularly, embodiments of the invention relate to a NAND flash memory device performing an error detecting and data reloading operation during a copy back program operation.

This application claims the benefit of Korean Patent Application No. 2005-83216 filed Sep. 7, 2005, the subject matter of which is hereby incorporated by reference.

2. Description of the Related Art

A broad class of semiconductor memory devices has been developed to store and subsequently provide data within various electronic and computer applications. Semiconductor memory devices may be generally classified into random access memory (RAM) devices and read only memory (ROM) devices. The data stored in a RAM device is volatile in nature, that is, it is lost when power is no longer applied to the RAM. In contrast, data stored in ROM is nonvolatile in nature. It remains stored in ROM even when power is no longer applied to the ROM.

RAM devices may be further classified as dynamic RAM (DRAM), static RAM (SRAM), etc. ROM devices may be further classified as programmable ROM (PROM), erasable PROM (EPROM), electrically EPROM (EEPROM), flash memory, etc. Flash memory devices include NAND flash memory devices and NOR flash memory devices.

The NAND flash memory device supports a so-called "copy back program" operation in addition to the customary program, read, and erase operations. The copy back program operation is essentially adapted to "copy back" data stored on a source page into a target page. That is, the data stored on the source page is temporarily stored on a page buffer, and then immediately programmed into the target page. Through use of the copy back program operation, the programming speed of a NAND flash memory device may be markedly improved, because the otherwise duplicate process of reading data from the source page, as well as the process of externally reloading data may be omitted.

However, a conventional NAND flash memory device may generate a 1-bit error during the process of reading data from the source page through a page buffer during a copy back program operation. Additionally, another 1-bit error may be generated during the process of reading data from the target page. That is, the conventional NAND flash memory device may generate two (2) 1-bit errors (or a cumulative 2-bit error) during a conventional copy back program operation.

Generally, a NAND flash memory device may readily correct a 1-bit error in a single page of data as it passes through an associated memory controller. This is, however, not the case for a 2-bit error.

SUMMARY OF THE INVENTION

Embodiments of the invention provide a NAND flash memory device adapted to prevent the generation of a 2-bit error during a copy back program operation.

Thus, in one embodiment, the invention provides a NAND flash memory device comprising; a cell array comprising a plurality of planes, a parity cell array comprising a plurality of parity planes, each parity plane storing parity data associated with a corresponding one of the plurality of planes, and a parity generation and parity column selection circuit adapted to generate new parity data associated with reloaded data during a copy back program operation, and further adapted to program the new parity data in a parity plane corresponding to a plane storing the reloaded data.

In another embodiment, the invention provides a NAND flash memory device comprising; a cell array comprising a plurality of planes, a parity cell array comprising a plurality of parity planes, each parity plane storing parity data associated with a corresponding one of the plurality of planes, a parity generation circuit adapted to generate parity data to be stored on each one of the plurality of parity planes upon receiving data to be stored on the corresponding plurality of planes, and a parity column selection circuit supplying the parity data to the parity cell array in response to a column address signal after receiving the parity data from the parity generation circuit, wherein the parity generation circuit if further adapted to generate new parity data associated with reloaded data during a copy back program operation, and the parity column selection circuit is further adapted to supply the new parity data to a parity plane selected by the column address signal.

DESCRIPTION OF EXEMPLARY EMBODIMENTS

Several embodiments of the invention will now be described with reference to the accompanying drawings. However, the present invention is not limited to only the illustrated embodiments. Rather, the embodiments are presented as teaching examples.

A NAND flash memory device according to one embodiment of the invention is adapted to generate an error detection code (EDC) during a copy back program operation, and is further adapted to perform an error detecting operation. Additionally, the NAND flash memory device performs a data reloading operation during a copy back program operation. The error detecting operation and the data reloading operation will be described with reference to the exemplary block diagrams shown in FIGS. 1 and 2.

Figure 1:
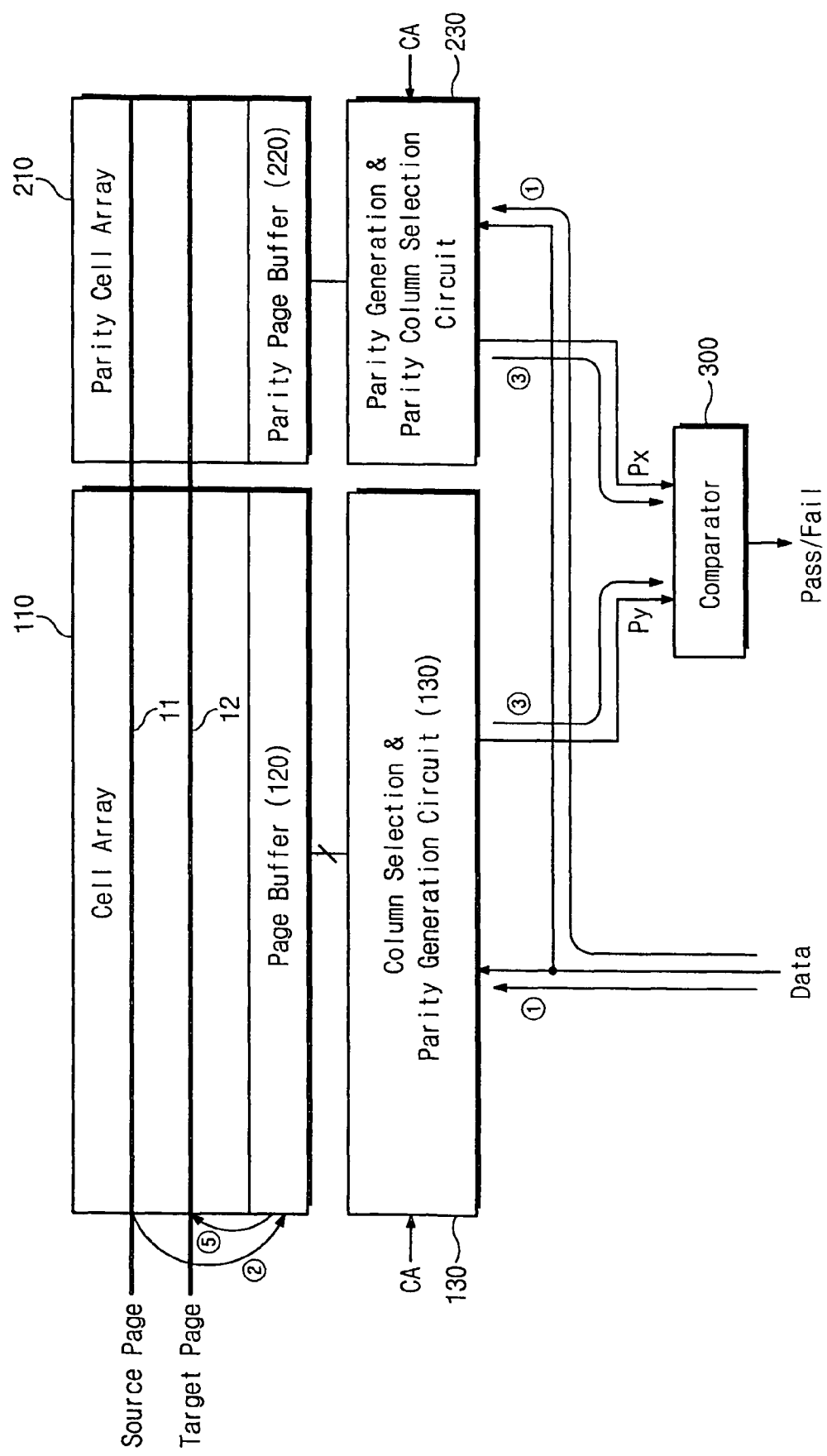
FIG. 1 is a block diagram illustrating an error detecting operation for a NAND flash memory device according to an embodiment of the invention.

FIG. 1 is a block diagram illustrating an exemplary execution of an error detecting operation adapted for use in a NAND flash memory device according to an embodiment of the invention. Referring to FIG. 1, the exemplary NAND flash memory device includes a cell array 110, a page buffer 120, a column selection and a parity generation circuit 130, a parity cell array 210, a parity page buffer 220, a parity generation and parity column selection circuit 230, and a comparator 300.

Cell array 110 and parity cell array 210 facilitate program and read operations in a conventional page mode. Cell array 110 stores data and the parity cell array 210 stores the EDC.

The EDC functions as parity data. Parity data is stored on a page by page basis in relation to a corresponding page of data stored in cell array 110.

Page buffer 120 temporarily stores data to be programmed into cell array 110 or data to be read from cell array 110. Parity page buffer 220 temporarily stores parity data to be programmed into parity cell array 210 or data to be read from parity cell array 210.

Column selection and parity generation circuit 130 receives data from an external data input buffer (not shown), and supplies data to page buffer 120 in response to a column address (CA) signal. Column selection and parity generation circuit 130 generates first parity data (Py) from data received from page buffer 120, and supplies first parity data (Py) to comparator 300.

Parity generation and parity column selection circuit 230 generates second parity data (Px) from data received from a data input buffer (not shown) in response to the column address (CA) signal. Alternatively, parity generation and parity column selection circuit 230 receives second parity data (Px) from parity page buffer 220 and supplies this data to comparator 300.

Comparator 300 detects an error by comparing first and second parities data (Px and Py). Comparator 300 outputs a pass signal when first and second parity data (Px and Py) are identical, and a fail signal if different. During the copy back program operation, comparator 300 generates a fail signal when an error occurs in an operation reading data stored in source page 11 of cell array 110, for example.

Hereinafter, an exemplary error detection operation in a NAND flash memory device, which also performs a copy back program operation, will be described in some additional detail with reference to FIG. 1.

First, data input from an external data input buffer (not shown) is programmed to a source page via data flow ①. Column selection and parity generation circuit 130 receives the input data, and transmits it to page buffer 120 in response to the column address (CA) signal. Here, a data loading operation is used to transmit the input data to page buffer 120. That is, the input data is transmitted to page buffer 120 through the data loading operation. On the other hand, parity generation and parity column selection circuit 230 generates second parity data (Px) from the input data, and transmits the second parity data (Px) to the parity page buffer 220 in response to the column address (CA) signal.

The input data loaded into page buffer 120 and the corresponding first parity data (Py) loaded into parity page buffer 220 are programmed at the same time by the program operation.

Referring to data flow ②, the data and corresponding parity data stored in relation to a source page in cell array 110 and parity cell array 210 are read into page buffer 120 and parity page buffer 220, respectively. A 1-bit error may be generated during the process of reading data from source page 11. Within the context of embodiments of the invention, an error detection operation is used to detect this 1-bit error.

Referring to data flow ③, the 1-bit error generated during the read operation is detected by comparing corresponding first parity data (Py), which is generated by column selection and parity generation circuit 130, with second parity data (Px), which is generated by parity generation and parity column selection circuit 230. Column selection and parity generation circuit 130 generates first parity data (Py) from read data stored in page buffer 120, and then supplies first parity data (Py) to comparator 300. Parity generation and parity column selection circuit 230 supplies second parity data (Px) stored in parity page buffer 220 to comparator 300. Comparator 300 generates a pass signal when the first and second parity data (Py and Px) are identical, and generates a fail signal when they are different. Here, where second parity data (Px) is equal to first parity data (Py) no 1-bit error has been generated during the read operation associated with source page 11. However, where second parity data (Px) is different from first parity data (Py), a 1-bit error has occurred.

Figure 2:
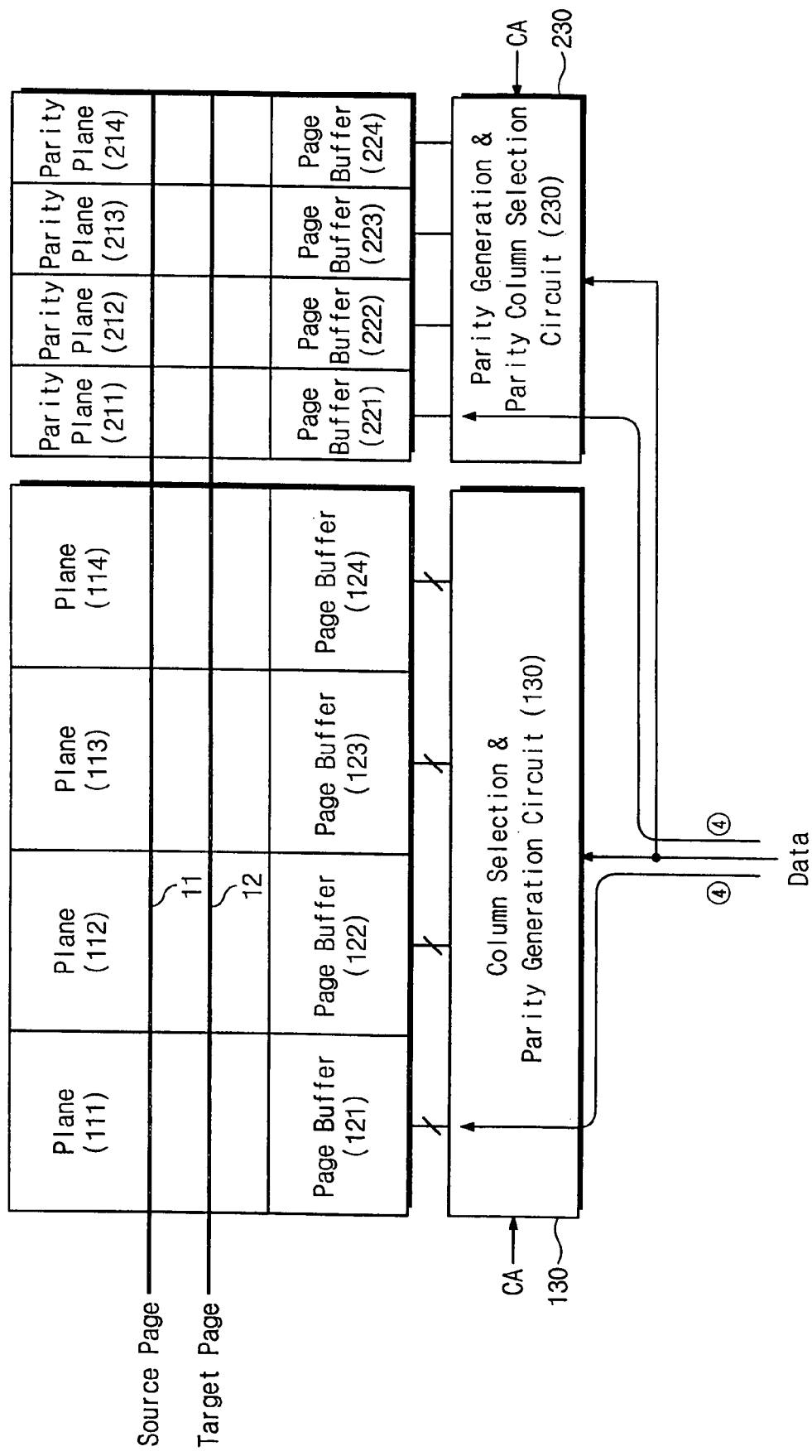
FIG. 2 is a block diagram illustrating a data reloading operation for a NAND flash memory device according to an embodiment of the invention.

Referring to data flow ④ shown in FIG. 2, a data reloading operation is performed. The data reloading operation will be described in some additional detail with reference to FIG. 2.

Referring to data flow ⑤, the read data stored in page buffer 120 and the corresponding parity data stored in parity page buffer 220 are programmed into a target page 12 when the first and second parity data (Px and Py) are identical as determined above. In contrast, when a 1-bit error occurs during the copy back program operation, the copy back program may be terminated or an error correction operation may be performed before completion of the copy back operation.

Figure 3:
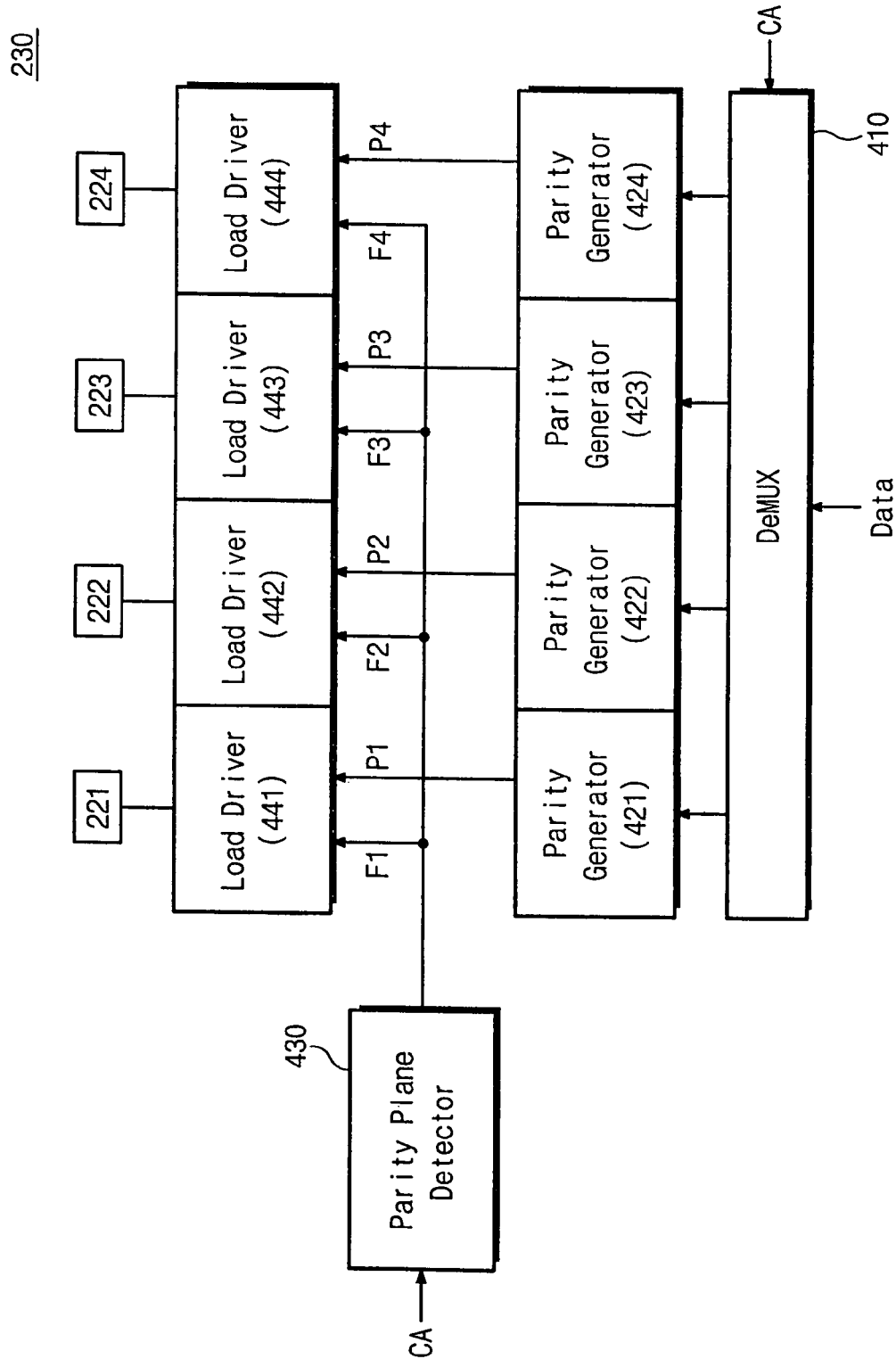
FIG. 3 is a block diagram illustrating an internal configuration of a parity generating and parity column selecting circuit illustrated in FIG. 2.
Figure 4:
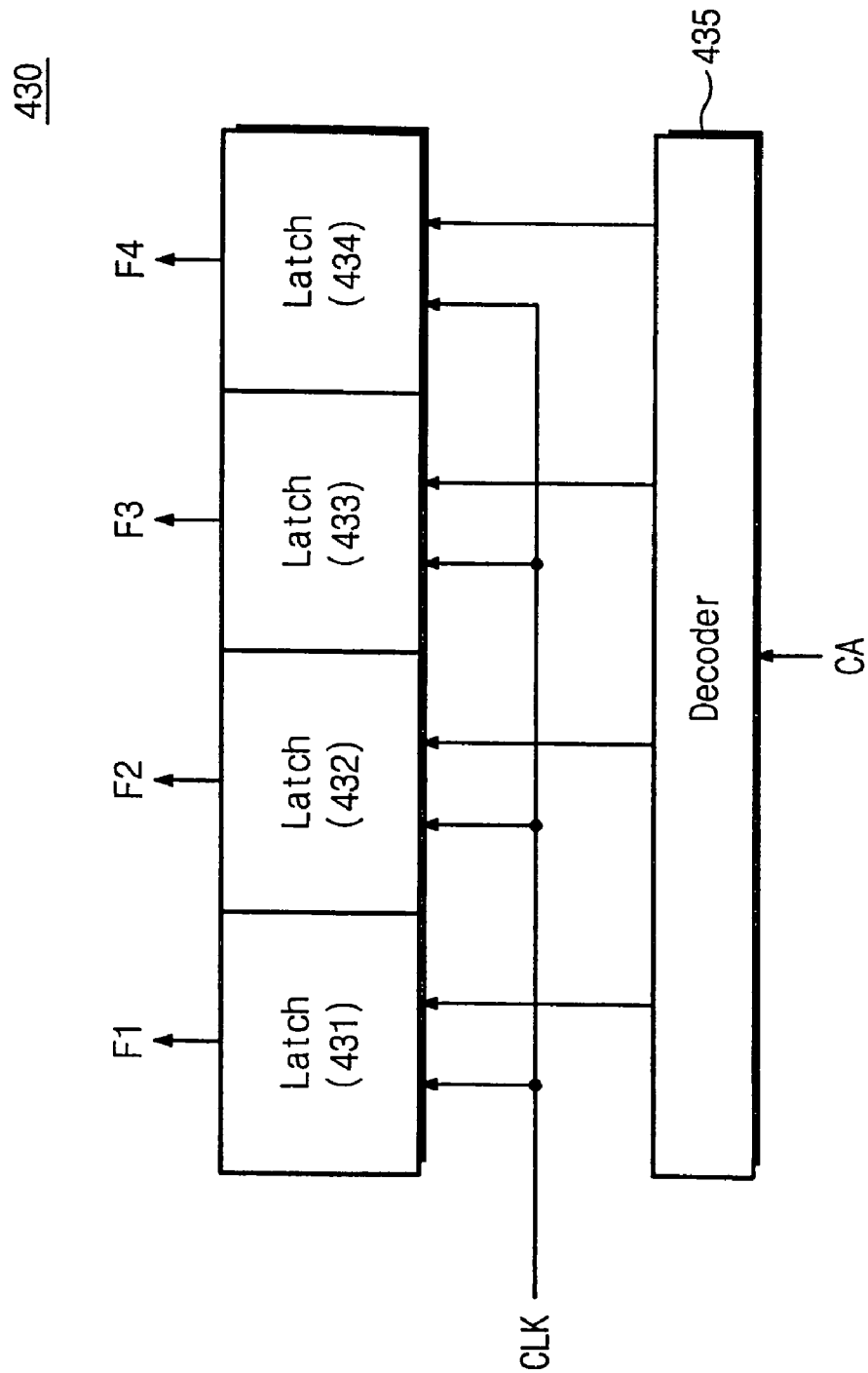
FIG. 4 is block diagram illustrating an internal configuration of a parity plane detector illustrated in FIG. 3.

FIGS. 2 through 4 are diagrams illustrating an exemplary data reloading operation adapted for use with a NAND flash memory device according to an embodiment of the invention. Here, the data reloading operation is used to replace a portion of source page 11 with new data during a copy back program operation. That is, the data loading operation is used to reload new data into page buffer 120 after reading data stored in source page 11 into page buffer 120 via data flow ②. At this point, new parity data for the reloaded data must be stored into parity page buffer 220.

FIG. 2 is a block diagram illustrating an exemplary data reloading operation adapted for use with a NAND flash memory device according to an embodiment of the invention. Referring to FIG. 2, a plurality of planes 111 through 114 and a plurality of parity planes 211 through 214 are defined in a cell array and a parity cell array, respectively. That is, cell array 110 may comprises a plurality of planes 111 through 114, and parity cell array 210 may comprises a plurality of parity planes 211 through 214. Referring to data flow ① in FIG. 1, parities planes 211 through 214 are used to store parity data associated with the data stored in planes 111 through 114, respectively. In the illustrated example, parity cell array 210 is assumed to store 4-bit parity data.

The data and associated parity data for source page 11 are read into page buffer 120 and parity page buffer 220 via data flow ②, the error detection operation is performed via data flow ③, and then the data reloading operation is performed via data flow ④. For example, it is assumed for illustrative purposes that new data is reloaded into first page buffer 121. At this point, new parity data associated with the reloaded data must be stored into first parity page buffer 221.

Referring to FIG. 2, column selection and parity generation circuit 130 receives the reloaded data during the data reloading operation and transmits the reloaded data to first page buffer 121 in response to the column address (CA) signal. On the other hand, parity generation and parity column selection circuit 230 generates new parity associated with the reloaded data, and transmits the new parity data to first parity page buffer 221 in response to the column address (CA) signal.

FIG. 3 is a block diagram further illustrating an internal configuration of an exemplary parity generation and parity column selection circuit like the one illustrated in FIG. 2. Referring to FIG. 3, the parity generation and parity column selection circuit 230 comprises a demultiplexer 410, a plurality of parity generators 421 to 424, a parity plane detector 430, and a plurality of load drivers 441 to 444.

Demultiplexer 410 receives the reloaded data during the data reloading operation, and selects a parity generator that generates new parity in response to the column address (CA)

signal. For example, demultiplexer 410 receives the reloaded data and transmits the data inputted in response to column address (CA) signal to first parity generator 421.

Each of a plurality of parity generators 421 to 424 has an identical configuration and an operational principle. Referring to data flow ① shown in FIG. 1, parity generators 421 to 424 generate parity data P1 to P4, respectively. During a data reloading operation, first parity generator 421 receives the reloaded data and generates first new parity P1'. At this point, the second through fourth parity generators 422 to 424 maintain the previous parities P2 to P4.

Parity plane detector 430 detects a parity plane in response to the column address (CA) signal during the data reloading operation and generates a flag signal as a detection result. As described above, parity plane detector 430 detects the first parity plane 211, and generates the first flag signal. A configuration and an operation of parity plane detector 430 will be described in some additional detail with reference to FIG. 4.

A plurality of load drivers 441 to 444 have an identical configuration and an operational principle. The plurality of load drivers 441 to 444 transmit parities, which are generated from a plurality of parity generators 421 to 424 in response to a flag signal generated from the parity plane detector 430, to a plurality of parity page buffers 221 to 224. As described above, first load driver 441 transmits the first new parity P1' to first parity page buffer 221 in response to first flag signal F1 during the data loading operation FIG. 4 is block diagram further illustrating an exemplary internal configuration of a parity plane detector as illustrated in FIG. 3. Referring to FIG. 4, parity plane detector 430 includes a plurality of latches 431 to 434, and a decoder 435.

The plurality of latches 431 to 434 store flag signals F1 to F4, and transmits the flag signals F1 to F4 to a plurality of load drivers 441 to 444 of FIG. 3 in synchronization with a clock signal CLK during the data loading operation. The decoder 435 decodes the column address (CA) signal and enables one among the plurality of latches 431 to 434 during the data loading operation. As described above, decoder 435 decodes the column address (CAO signal and then enables the first latch 431. First latch 431 supplies first flag signal F1 to first load driver 441 in synchronization with the clock signal (CLK).

As described above, a NAND memory flash memory device is disclosed that performs error detection and data reloading operations during a copy back program operation. In one aspect, the NAND flash memory device generates new parity associated with reloaded data when the data reloading operation is performed during the copy back program operation. The new parity is programmed on a parity plane selected by a column address signal.

As described above, a NAND flash memory device according to an embodiment of the invention can detect a 1-bit error generated during a data read operation associated with a source page during the copy back program operation. The NAND flash memory device generates new parity associated with the reloaded data and programs the new parity into a parity plane selected by the column address signal when the data reloading operation is performed during the copy back program operation.

It will be apparent to those skilled in the art that various modifications and variations can be made to the foregoing embodiments which are presented in the context of exemplary circuits. Thus, it is intended that the present invention cover the modifications and variations to the embodiments as defined by the appended claims and their equivalent.

What is claimed is:

1. A NAND flash memory device configured to perform a program operation, and a copy back program operation, the memory device comprising:
    a cell array comprising a plurality of planes, wherein each plane is configured to store program data;
    a parity cell array comprising a plurality of parity planes, wherein each parity plane is configured to store parity data associated with program data stored in a corresponding one of the plurality of planes;
    a column selection and parity generation circuit configured to receive the program data during the program operation;
    a page buffer configured to receive the program data from the column selection and parity generation circuit during the program operation, and further configured to receive source page data from a source page of the cell array during the copy back program operation;
    a parity page buffer configured to receive source page parity data from a source parity page of the parity cell array corresponding to the source page during the copy back program operation; and
    a parity generation and parity column selection circuit,
    wherein the column selection and parity generation circuit and the parity generation and parity column selection circuit are configured to cooperatively detect an error in the source page data during the copy back program operation,
    the column selection and parity generation circuit is further configured to reload the source page data upon detection of the error in the source page data to a selected plane in the cell array, and
    the parity generation and parity column selection circuit is configured to generate new source page parity data for the reloaded source page data and program the new source page parity data in a selected parity plane corresponding to the selected plane storing the reloaded source page data.

2. The NAND flash memory device of claim 1, wherein the parity generation and parity column selection circuit is further configured to determine the selected parity plane in response to a column address signal.

3. The NAND flash memory device of claim 1, wherein the parity generation and parity column selection circuit comprises a plurality of parity generators and is further configured to select one of the plurality of parity generators to generate the new source page parity data in response to a column address signal.

4. The NAND flash memory device of claim 3, wherein the parity generation and parity column selection circuit further comprises a selection circuit configured to select the selected one of the plurality of parity generators.

5. The NAND flash memory device of claim 4, wherein the parity generation and parity column selection circuit further comprises a parity plane detector configured to receive the column address signal and generate a flag signal in response to the column address signal.

6. The NAND flash memory device of claim 4, wherein the parity generation and parity column selection circuit further comprises a plurality of load drivers, wherein each one of the plurality of load drivers receives the flag signal and is respectively connected to one of the plurality of parity generators.

7. The NAND flash memory device of claim 4, wherein the selection circuit comprises a demultiplexer.

* * * * *